United States Patent
Jung et al.

(10) Patent No.: US 12,544,804 B2
(45) Date of Patent: Feb. 10, 2026

(54) BOWL FOR PROCESSING A SUBSTRATE AND PROCESSING SUBSTRATE DEVICE INCLUDING THE SAME

(71) Applicant: SEMES CO., LTD., Chungcheongnam-do (KR)

(72) Inventors: Sun Wook Jung, Gyeonggi-do (KR); Hyun Yoon, Seoul (KR); Ha Neul Yoo, Gyeonggi-do (KR); Ho Jong Hwang, Gyeonggi-do (KR)

(73) Assignee: SEMES CO., LTD., Chungcheongnam-do (KR)

( * ) Notice: Subject to any disclaimer, the term of this patent is extended or adjusted under 35 U.S.C. 154(b) by 147 days.

(21) Appl. No.: 18/386,914

(22) Filed: Nov. 3, 2023

(65) Prior Publication Data
US 2024/0216957 A1 Jul. 4, 2024

(30) Foreign Application Priority Data

Dec. 29, 2022 (KR) .................. 10-2022-0188140

(51) Int. Cl.
*B08B 3/02* (2006.01)
*B08B 13/00* (2006.01)
*H01L 21/67* (2006.01)

(52) U.S. Cl.
CPC ............ *B08B 3/022* (2013.01); *B08B 13/00* (2013.01); *B08B 2203/0264* (2013.01); *H01L 21/67051* (2013.01)

(58) Field of Classification Search
None
See application file for complete search history.

(56) References Cited

U.S. PATENT DOCUMENTS

2015/0343496 A1 12/2015 Song et al.

FOREIGN PATENT DOCUMENTS

| JP | 6-77120 | 3/1994 |
|----|---------|--------|
| JP | 10-57876 | 3/1998 |
| JP | 2020-155590 | 9/2020 |
| KR | 10-2010-0008579 | 1/2010 |
| KR | 10-2015-0138544 | 12/2015 |
| KR | 101736441 B1 * | 5/2017 ............ G03F 7/162 |

(Continued)

OTHER PUBLICATIONS

KR 101736441 B1, Apparatus For Treating Substrate And Method For Cleaning Guide Plate, Kim (Year: 2017).*

(Continued)

*Primary Examiner* — Cristi J Tate-Sims
(74) *Attorney, Agent, or Firm* — WOMBLE BOND DICKINSON (US) LLP

(57) ABSTRACT

According to the present disclosure, provided is a bowl receiving incident droplets and preventing the same from scattering, or causing the same to scatter downwardly, the bowl including: a main body surrounding a substrate support unit; a groove formed in a spiral shape in at least a portion of an inner surface of the main body; and a separation wall disposed between adjacent grooves in a vertical direction on the inner surface of the main body, wherein a thickness at a first position in the main body in which the groove is formed is greater than a thickness at a second position, lower than the first position.

19 Claims, 8 Drawing Sheets

(56) References Cited

FOREIGN PATENT DOCUMENTS

KR    10-2022-0051730    4/2022

OTHER PUBLICATIONS

Yu Sik Kong and Tae Wan Kim, "Wettability of Biomimetic Riblet Surface like Sharkskin", Journal of the KSTLE vol. 29, No. 5, Oct. 2013, pp. 304-309.
Seongmin Hwang and Jintaek Jeong, "A Study on the Skin Friction Drag Reduction using Riblets in Micro Air Vehicles", Korean Society of Aeronautics and Astronautics, 2004, pp. 67-70.
Office Action dated Feb. 15, 2024 for Korean Patent Application No. 10-2022-0188140 and its English machine translation by Google Translate.

\* cited by examiner

C

BOWL FOR PROCESSING A SUBSTRATE AND PROCESSING SUBSTRATE DEVICE INCLUDING THE SAME

CROSS-REFERENCE TO RELATED APPLICATION (S)

This application claims the benefit of a priority to Korean Application No. 10-2022-0188140 filed on Dec. 29, 2022 in the Korean Intellectual Property Office, the entire disclosure of which is incorporated herein by reference for all purposes.

BACKGROUND

The present disclosure relates to a bowl for processing a substrate and a substrate processing device including the same.

Contaminants such as particles, organic contaminants, metal contaminants, and the like remaining on a surface of a substrate have a significant impact on characteristics and production yield of semiconductor devices. For this reason, a cleaning process removing various contaminants attached to the surface of the substrate is important in a semiconductor manufacturing process, and a process of cleaning and processing the substrate is performed before and after each unit process for manufacturing a semiconductor. In general, cleaning of the substrate includes a chemical treatment process removing metal contaminants, organic substances, particles, or the like, remaining on the substrate using chemicals, a rinsing process for removing chemicals remaining on the substrate using pure water, and a drying process drying the substrate using an organic solvent, nitrogen gas, or the like.

Patent Document 1 discloses a general device used in the cleaning process. The device includes a container capable of recovering a plurality of processing liquids and a substrate support member within the container. In the device, a textured surface is provided on an inner surface of the container. However, when using the above-described container, a chemical solution used to clean the substrate hits the inner surface of the container due to centrifugal force and then bounces back onto the substrate, thereby re-contaminating the substrate, and in this case, even if the texture is formed, upward scattering occurs due to the texture.

(Patent Document 1) KR 10-2015-0138544 A

SUMMARY

The present invention is intended to solve the above-described problems, and an aspect of the present disclosure is to provide a bowl receiving incident droplets and preventing the same from scattering, or causing the same to scatter downwardly, and a substrate processing device including the same.

In order to achieve the above-described object, an aspect of the present disclosure is to provide a bowl and a substrate processing device as follows.

According to an aspect of the present disclosure, provided is a bowl, the bowl including: a main body surrounding a substrate support unit; a groove formed in a spiral shape in at least a portion of an inner surface of the main body; and a separation wall disposed between adjacent grooves in a vertical direction on the inner surface of the main body, wherein a thickness at a first position in the main body in which the groove is formed is greater than a thickness at a second position, lower than the first position.

According to an aspect of the present disclosure, provided is a substrate processing device, the substrate processing device including: a container having a processing space therein; a substrate support unit located inside the container and supporting a substrate; and a nozzle unit spraying a processing liquid onto the substrate disposed on the substrate support unit, wherein the container includes a bowl provided with an entrance open in a vertical direction, wherein the bowl includes a main body surrounding the substrate support unit and a groove formed in a spiral shape in at least a portion of the inner surface of the main body, wherein the groove includes the upper groove wall having a first curved surface on an upper side and a lower groove wall having a second curved surface on a lower side, and a radius of curvature of the first curved surface is greater than a radius of curvature of the second curved surface.

According to an aspect of the present disclosure, provided is a substrate processing device, the substrate processing device including: a container having a processing space therein; a substrate support unit located inside the container and supporting a substrate; and a nozzle unit spraying a processing liquid onto the substrate disposed on the substrate support unit, wherein the container includes a bowl provided with an entrance open in a vertical direction, wherein the bowl includes a main body surrounding the substrate support unit; a groove formed in a spiral shape on an inner surface of the main body; and a separation wall disposed between adjacent grooves in a vertical direction on the inner surface of the main body, wherein the main body includes a flat portion whose outer surface extends in the vertical direction and an inclined portion whose outer surface is formed as an inclined surface with respect to the vertical direction, wherein the groove is formed at least in an inner surface corresponding to the flat portion, and when viewed in a cross-section perpendicular to a circumferential direction of the main body, the groove includes a first groove, a second groove, adjacent to the first groove and located below the first groove, and a third groove, adjacent to the second groove and located below the second groove, wherein the separation wall includes a first separation wall disposed between the first groove and the second groove, and a separation wall disposed between the second groove and the third groove, wherein a virtual line connecting innermost points of the first separation wall and the second separation wall is inclined at a first angle in the vertical direction so that a distance from a central line of the bowl increases downwardly, wherein the first virtual line and a second virtual line connecting outermost points of the first and second grooves are parallel, wherein the first separation wall includes a first inner surface parallel to the first virtual line and a second inner surface extending from the first groove and inclined with respect to the first virtual line, wherein a second angle formed by the second inner surface and the first inner surface is greater than a third angle formed by an upper groove wall in which the first inner surface extends to a groove below the separation wall and the first inner surface, wherein the groove includes an upper groove wall having a first curved surface connected to an upper separation wall and a lower groove wall having a second curved surface connected to a lower separation wall, and a radius of curvature of the first curved surface is greater than a radius of curvature of the second curved surface, and the first angle is between 1 and 3°.

BRIEF DESCRIPTION OF DRAWINGS

The above and other aspects, features, and advantages of the present disclosure will be more clearly understood from the detailed in following description, taken conjunction with the accompanying drawings, in which.

DETAILED DESCRIPTION

Figure 1:
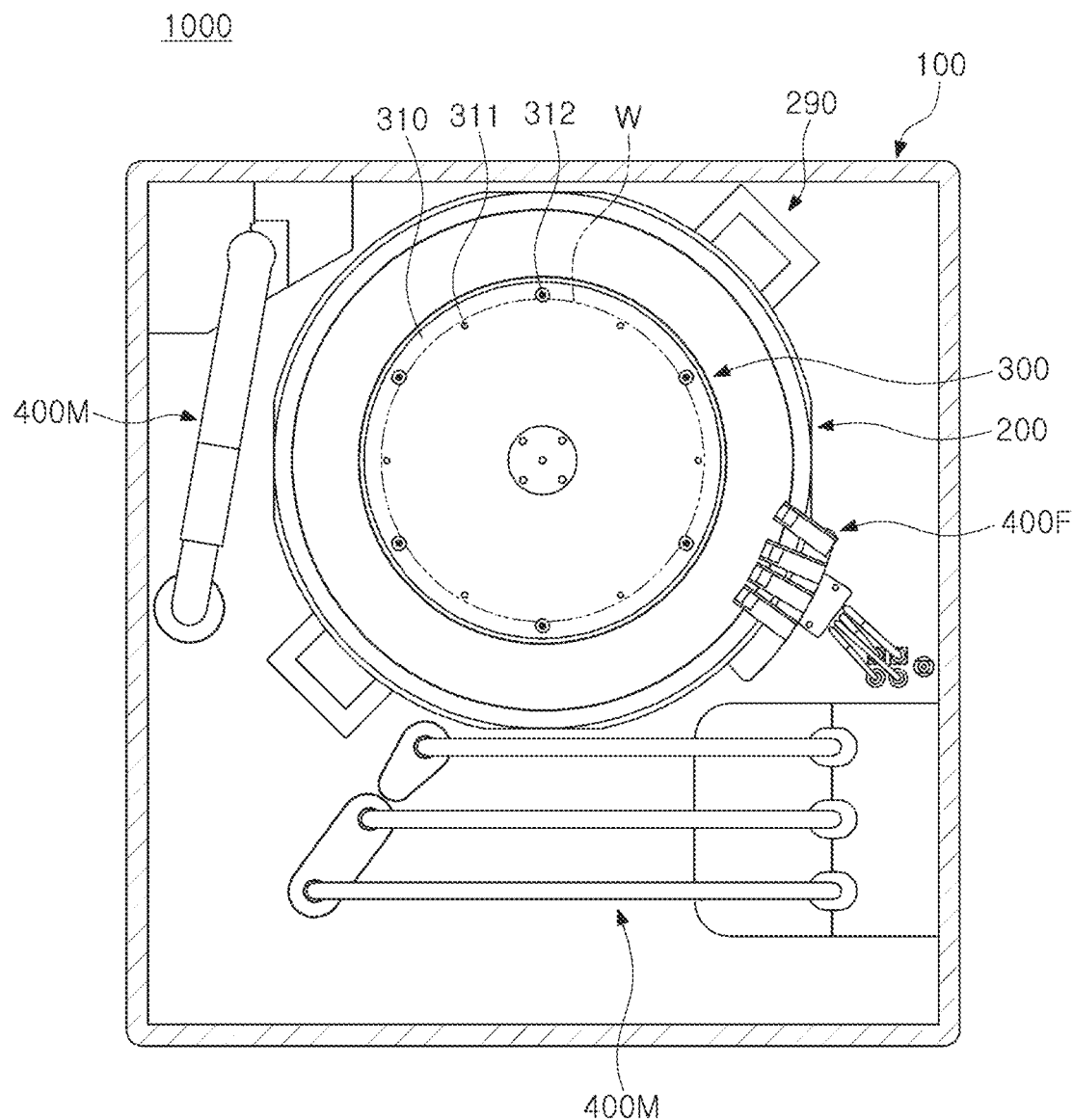
FIG. 1 is a plan view schematically illustrating a substrate processing device according to an embodiment of the present disclosure.

Hereinafter, preferred embodiments of the present disclosure will be described in detail so that those skilled in the art could easily practice the present disclosure with reference to the accompanying drawings. However, in describing a preferred embodiment of the present disclosure in detail, if it is determined that a detailed description of a related known function or configuration may unnecessarily obscure the subject matter of the present disclosure, the detailed description will be omitted. In addition, the same reference numerals are used throughout the drawings for parts having similar functions and actions. In addition, in the present specification, terms such as 'upper,' 'upper portion,' 'upper surface,' 'lower,' 'lower portion,' 'lower surface,' 'side surface,' and the like are based on the drawings, and in practice, it may be different depending on a direction in which the components are disposed.

In addition, throughout the specification, when a part is said to be 'connected' to another part, this is not only when it is 'directly connected,' but also when it is 'indirectly connected' with other components therebetween. In addition, 'including' a certain component means that other components may be further included without excluding other components unless otherwise stated.

Figure 2:
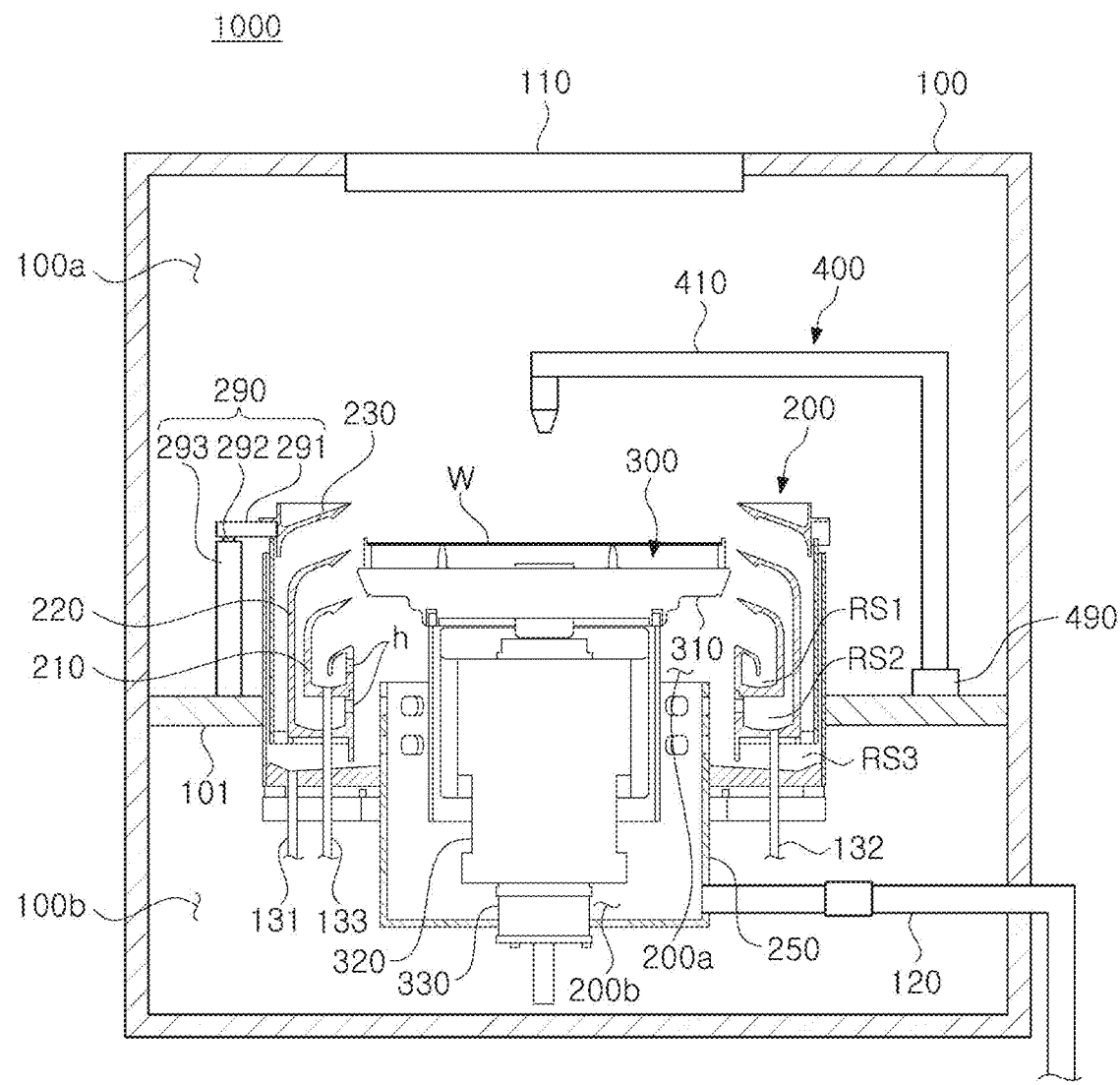
FIG. 2 is a schematic plan view of a substrate processing device provided in a chamber for processing a substrate according to an embodiment of the present disclosure.

FIG. 1 is a plan view illustrating a substrate processing device to which the present invention is applied, and FIG. 2 is a diagram illustrating an interior of the substrate processing device of FIG. 1.

Referring to FIG. 1, a substrate processing device 1000 of the present disclosure includes a process chamber 100 for performing a process on a substrate W using a liquid. Within this process chamber 100, a process is performed on the substrate W while the substrate W is maintained horizontally. The process may be a process of etching a nitride film formed on the substrate W. In this case, a liquid may contain phosphoric acid. Furthermore, the process chamber 100 may be used in a process to remove foreign substances and film materials remaining on a surface of the substrate W using various liquids.

Specifically, the process chamber 100 provides a sealed internal space, and a fan filter unit 110 is installed thereabove. The fan filter unit 110 generates a vertical airflow inside the process chamber 100. This fan filter unit 110 is one in which a filter and an air supply fan are modularized into one unit, and filters clean air and supplies the same into the process chamber 100. After passing through the fan filter unit 110, clean air is supplied into the process chamber 100 to form a vertical airflow. This vertical airflow provides a uniform airflow on an upper portion of the substrate W, and removes contaminants (fumes) generated in a process in which the surface of the substrate W is processed by treatment fluid are discharged together with air through bowls 210, 220, and 230 of a processing container 200 to discharge lines 131, 132, and 133, and removed, so that high cleanliness inside the processing container is maintained.

The process chamber 100 includes a process region 100a and a maintenance region 100b partitioned by a horizontal partition wall 101. A driving member 293 of a lifting unit 290 and a driving member 490 of a nozzle unit 400 are installed on the horizontal partition wall 101. In addition, the maintenance region 100b is a space in which the discharge lines 131, 132, and 133 connected to the processing container exhaust member 120 are located. It is preferable that the maintenance region 100b is isolated from the process region 100a where the substrate W is processed.

The substrate processing device 1000 of the present disclosure may include a processing container 200, a support unit 300, and a nozzle unit 400 in a process chamber 100. The processing container 200 is installed inside the process chamber 100, has a cylindrical shape with an open top, and provides a processing space for processing the substrate W. An open upper surface of the processing container 200 serves as a passage for loading and unloading the substrate W. Here, a support unit 300 is located in the processing space. In this case, the support unit 300 supports the substrate W while the process is performed, and rotates the substrate W.

In addition, the processing container 200 provides an upper space 200a in which a spin head 310 of the support unit 300 is located, and a lower space 200b to which an exhaust duct 250 is connected therebelow to enable forced exhaust. This exhaust duct 250 is connected to an exhaust member 120 extending externally of the process chamber 100. In the upper space 200a of the processing container 200, first, second, and third bowls 210, 220, and 230 in an annular type are disposed in multiple stages to introduce and suction the chemical liquid and gas scattered on the rotating substrate W. The first, second, and third bowls 210, 220, and 230 have exhaust ports h communicating with one common annular space (corresponding to a lower space of the processing container).

Here, the first, second, and third bowls 210, 220, and 230 provide first to third recovery spaces RS1, RS2, and RS3 into which an airflow containing liquid and fumes scattered from the substrate W flows. The first recovery space RS1 is formed by being partitioned by the first bowl 210, and the second recovery space RS2 is formed as a separation space between the first bowl 210 and the second bowl 220, and the third recovery space RS3 is formed as a separation space between the second bowl 220 and the third bowl 230.

In addition, the processing container 200 is coupled to a lifting unit 290 that changes a vertical position of the processing container 200. The lifting unit 290 moves the processing vessel 200 in a vertical direction. As the processing container 200 moves vertically, a relative height of the processing container 200 with respect to the spin head 310 changes. This lifting unit 290 has a bracket 291, a moving shaft 292, and a driving member 293. The bracket 291 is fixedly installed on an outer wall of the processing container 200, and a moving shaft 292 that moves in the vertical direction by a driving member 293 is fixedly coupled to the bracket 291. When the substrate W is loaded into or unloaded from the spin head 310, the processing container 200 descends so that the spin head 310 protrudes upwardly of the processing container 200.

In addition, when the process is in progress, depending on a type of liquid supplied to the substrate W, a height of the processing container 200 is adjusted so that the liquid is introduced to recovery spaces RS1, RS2, and RS3 between the preset bowls 210, 220, and 230. Accordingly, a relative vertical position between the processing container 200 and the substrate W is changed. Accordingly, the processing vessel 200 can vary the type of liquid and polluted gas recovered from each recovery space RS1, RS2, and RS3.

The support unit 300 is installed inside the processing container 200. The support unit 300 may support the substrate W while the process is in progress, and may be rotated by the driving member 330 while the process is in progress. In addition, the support unit 300 has a spin head 310 having a circular upper surface. The upper surface of the spin head 310 has a plurality of support pins 311 and a plurality of chucking pins 312 for supporting the substrate W. A plurality of support pins 311 are disposed on an edge portion of the upper surface of the spin head 310 to be spaced apart at regular intervals, and are provided to protrude upwardly from the spin head 310. The support pin 311 supports a lower surface of the substrate W so that the substrate W is supported while being spaced apart from the spin head 310 upwardly. A plurality of chucking pins 312 are disposed externally of the support pin 311, respectively, and the chucking pins 312 are provided to protrude upwardly. The plurality of chucking pins 312 align the substrate W supported by the plurality of support pins 311 so that the substrate W is disposed in a correct position on the spin head 310. While the process is in process, the plurality of chucking pins 312 are in contact with a side portion of the substrate W to prevent the substrate W from being separated from an original position thereof. A support shaft 320 supporting the spin head 310 is connected to a lower portion of the spin head 310, and the support shaft 320 is rotated by a driving member 330 connected to a lower end thereof. In this case, the driving member 330 is provided with a motor, or the like, and as the support shaft 320 rotates by the driving member 330, the spin head 310 and the substrate W rotate.

Meanwhile, the nozzle unit 400 discharges liquid onto the substrate W supported by the support unit 300. This nozzle unit 400 may be a moving nozzle device 400M or a fixed nozzle device 400F. In this case, a plurality of moving nozzle devices 400M may be installed outside the processing container 200.

As the support unit 300 rotates, droplets scattering from the substrate collide with the bowls 210, 220, and 230 of the processing container 200. As the droplets rebound on an inner surface of the bowls 210, 220, and 230, there is a problem of contaminating the substrate again, which is schematically illustrated in FIG. 3.

Figures 3A, 3B:
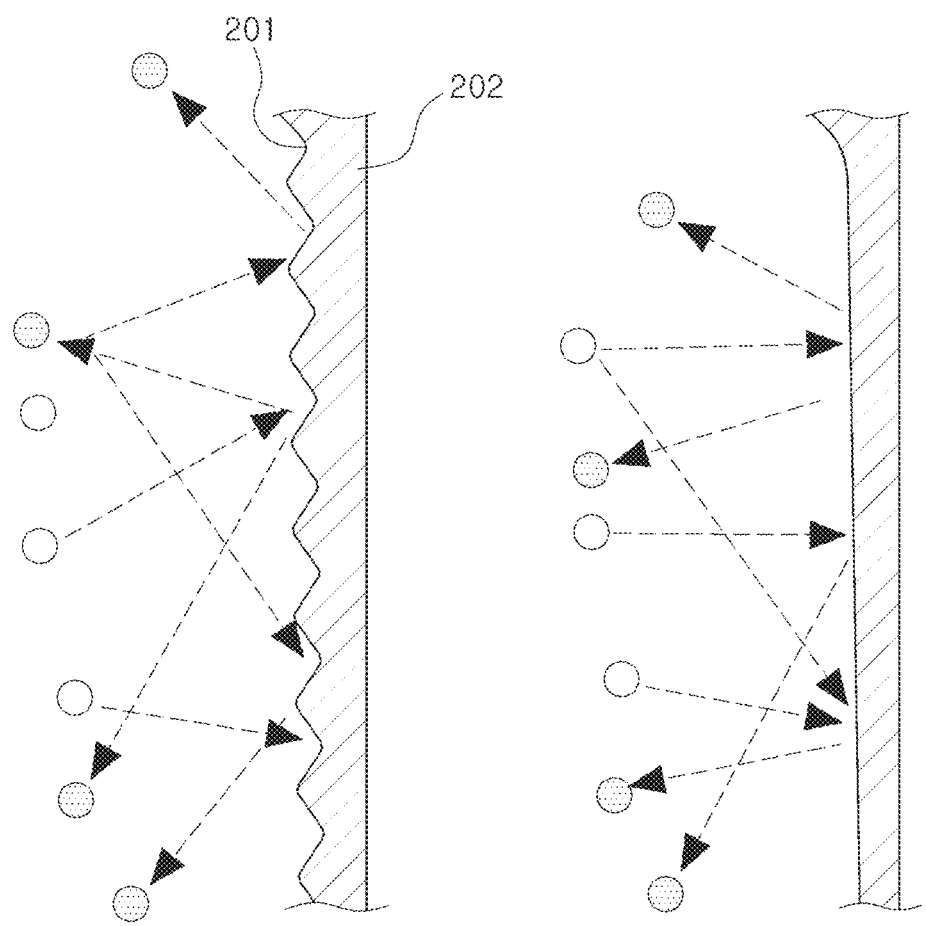
FIGS. 3A and 3B are diagrams illustrating droplet scattering in a bowl.

As shown in FIG. 3, rebound occurs both when a protrusion 201 is formed on the main body 202 of the bowl (FIG. 3A) or when a protrusion 201 is not formed (FIG. 3B), and some rebound upwardly, so that there is a risk of substrate contamination.

In addition, a shape of Patent Document 1 causes scattering upwardly occurs because the same shape is regularly repeated, scattering upwardly occurs, and even when there is no shape, upward scattering occurs because the surface is not actually flat. If the liquid is located on textures or protrusions, it may rather accelerate scattering.

The present invention is intended to prevent contamination of a substrate due to rebound, and a structure of a bowl according to an embodiment of the present disclosure will be described through FIGS. 4 to 7.

Figure 4:
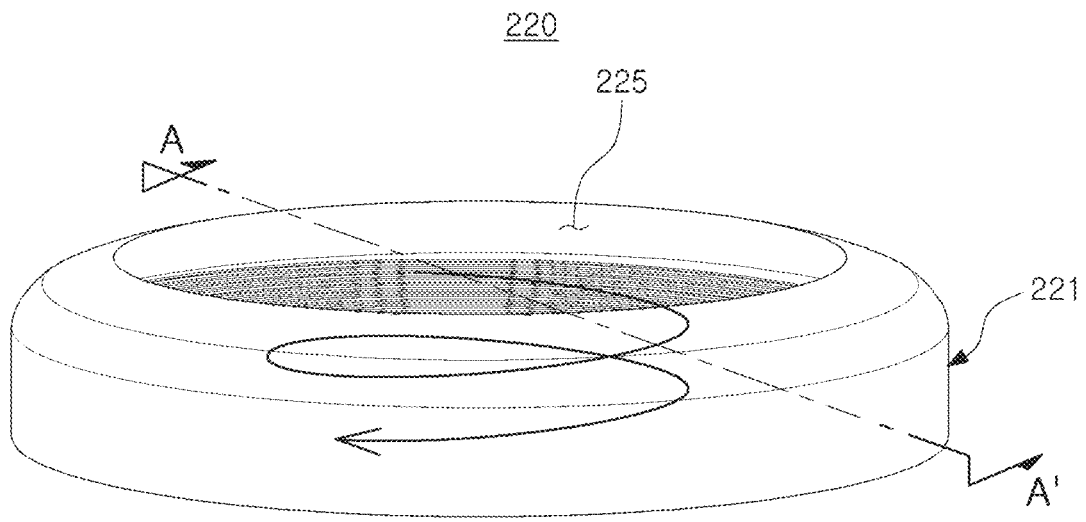
FIG. 4 is a schematic perspective view of a bowl according to an embodiment of the present disclosure.
Figure 5:
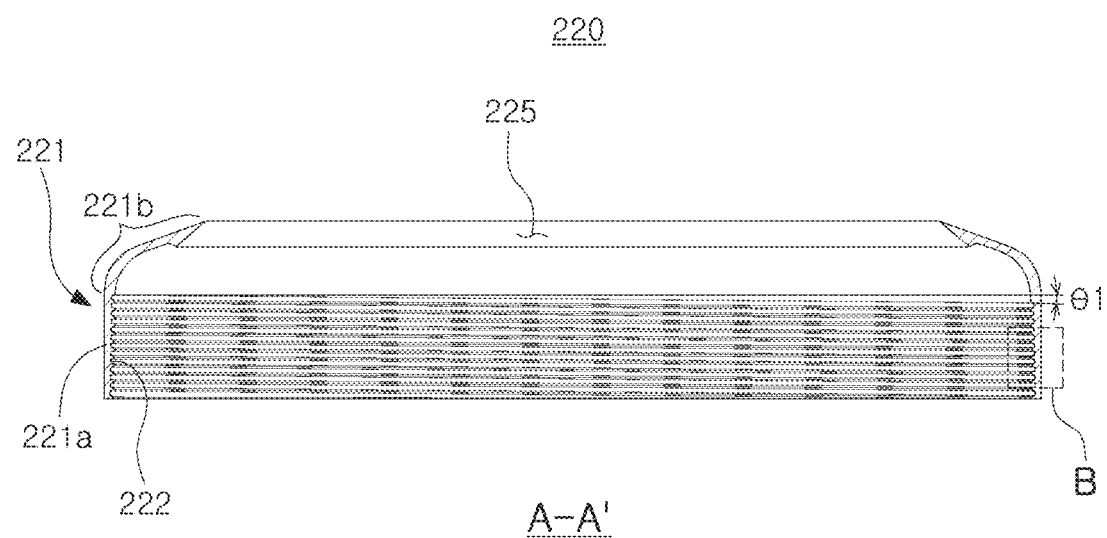
FIG. 5 is a cross-sectional view taken along line A-A' of FIG. 4.
Figure 6:
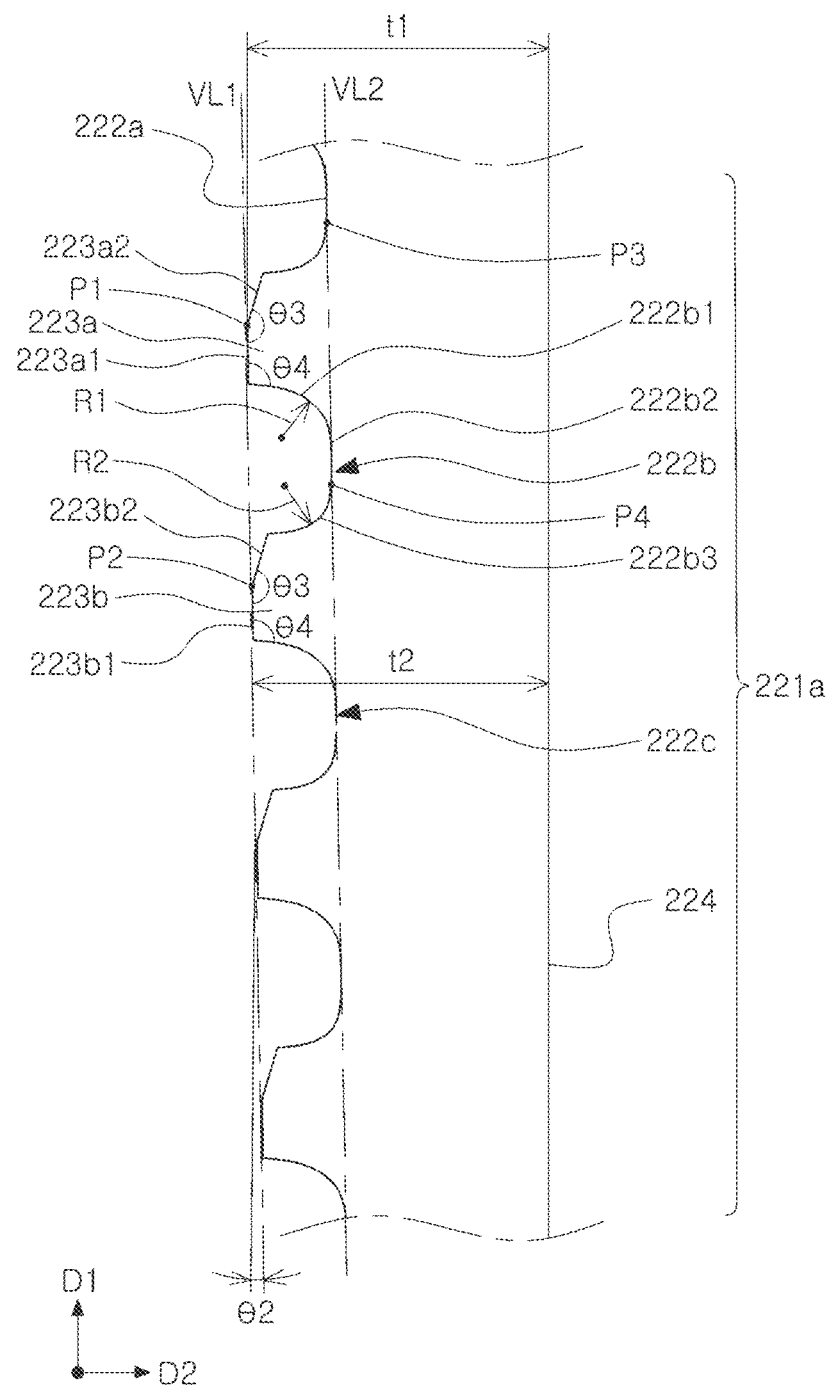
FIG. 6 is a partial cross-sectional view of a bowl according to an embodiment of the present disclosure.
Figure 7:
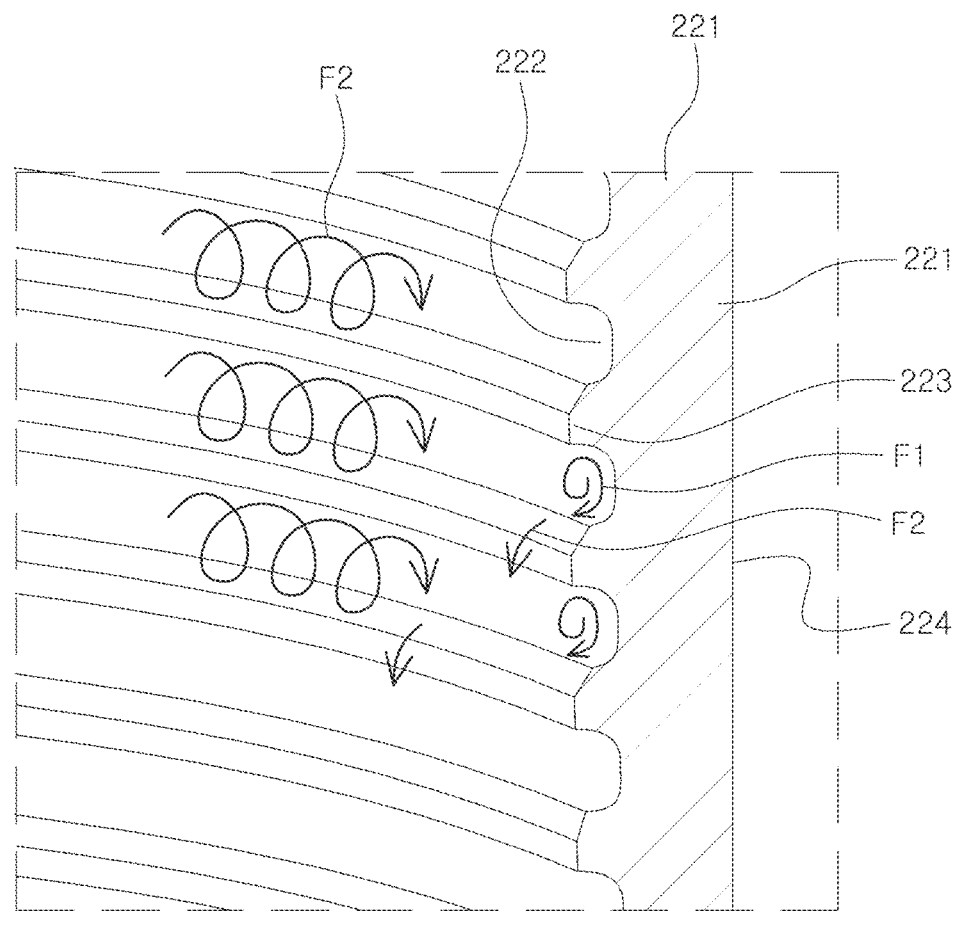
FIG. 7 is an enlarged view of portion B of FIG. 5.

FIG. 4 illustrates a schematic perspective view of a bowl according to an embodiment of the present disclosure, FIG. 5 illustrates a cross-sectional view taken along the line A-A' of FIG. 4, FIG. 6 illustrates a partial cross-sectional view of a bowl according to an embodiment of the present disclosure, and FIG. 7 is an enlarged view of portion B of FIG. 5.

FIGS. 4 to 7 illustrate a second bowl 220 of a substrate processing device 1000 of FIGS. 1 and 2 as an example, but a structure of the bowl according to an embodiment of the present disclosure may not only be applied to the second bowl 220, but also to other bowls. In addition, FIGS. 1 and 2 illustrate a substrate processing device 1000 including a plurality of bowls 210, 220, and 230, but a structure of the bowl of FIGS. 4 to 7 may also be applied to the substrate processing device 1000 including only one of the bowls 210, 220, and 230.

As shown in FIGS. 4 to 7, the bowl 220 according to an embodiment of the present disclosure has a main body 221 in which an opening 225 for entering and exiting a substrate is formed on an upper side thereof, and the main body 221 includes a flat portion 221a whose outer surface extends in a vertical direction and an inclined portion 221b extending from the flat portion 221a and whose outer surface is inclined as an inclined surface inclined inwardly. In an embodiment of the present disclosure, a groove 222 is formed on the inner surface of the flat portion 221a, and the groove 222 is formed in a spiral shape with an inclination angle θ1 with respect to a horizontal plane. In the groove 222, one groove may be connected in a spiral shape, but a plurality of grooves 222 may be disposed according to the inclination angle θ1.

The inclination angle θ1 may vary depending on a type and amount of scattering of a chemical liquid discharged by a nozzle unit 400, but may range from approximately 1 to 30°. If the inclination angle is less than 1°, it is difficult for the liquid to move downwardly in a spiral shape, and if the inclination angle exceeds 30°, the liquid moves downwardly and cannot remain in the groove 222, making it difficult to prevent rebound of scattering droplets.

A separation wall 223 is formed between adjacent grooves 222 in a vertical direction. The groove 222 and the separation wall 223 have the same shape and are alternately formed along the vertical direction. This will be described in more detail with reference to FIGS. 6 and 7.

In FIG. 6, the top groove 222 is known as a first groove 222a, grooves, which follow sequentially, are known as a second groove 222b and a third groove 222c, and the top separation wall 223, that is, a separation wall 223 between the first groove 222a and the second groove 222b is known as a first separation wall 223a, and a separation wall between the second groove 222b and the third groove 222c is known as a second separation wall 223b.

A first virtual line VL1 connecting innermost points P1 and P2 of the first separation wall 223a and the second separation wall 223b has an inclination angle θ2 with respect to a vertical direction D1 and extend. The first virtual line VL1 is inclined to be spaced apart from a central axis of the bowl in a radial direction D2 as it moves downwardly.

In addition, a second virtual line VL2 connecting an outermost point P3 of the first groove 222a and an outermost point P4 of the second groove 222b is parallel to the first virtual line VL1. That is, the second virtual line VL2 also extends at an inclination angle θ2 with respect to the vertical direction D1. This means that a structure in which the separation wall 223 and the groove 222 are repeatedly formed is disposed to be inclined with respect to the vertical direction D1. In this case, the inclination angle θ2 may be in a range of 1 to 3°, and preferably 1 to 2°. The inclination angle θ2 facilitates the liquid in the groove 222 moving beyond the separation wall 223 to the lower groove 222, and is required to be greater than 1° to allow the flow of liquid. A thickness reduction rate of the main body 221 may be determined by the inclination angle θ2, and may be 3° or less to reduce a speed.

Since the groove 222 and the separation wall 223 formed on the inner surface are inclined outwardly with respect to the vertical direction D1, but extend in the vertical direction D1 in the case of the outer surface 224, a thickness thereof in the flat portion 221*a* of the main body 221 is reduced downwardly. That is, a thickness t2 in the second separation wall 223*a* is smaller than a thickness t1 in the first separation wall 223*a*.

Likewise, a thickness in the second groove 222*b* is smaller than a thickness in the first groove 222*a*. In the present invention, since cross-sectional shapes of the grooves are the same, when comparing the thickness, a distance from the same position in the two grooves, for example, from an outermost point of the groove to the outer surface, is compared.

The first separation wall 223*a* includes a first inner wall 223*a*1 parallel to the first virtual line VL1 and a second inner surface 223*a*2 extending from an upper side of the first inner surface 223*a*1 and extending to be inclined from the first inner surface 223*a*1. The second inner surface 223*a*2 extends to be inclined with the first virtual line VL1.

An inclination angle θ3 between the first inner surface 223*a*1 and the second inner surface 223*a*2 is formed as an obtuse angle, and when droplets collect in the first groove 222*a*, the droplets are configured to flow downwardly along the second inner surface 223*a*2 and the first inner surface 223*a*1.

Meanwhile, an upper groove wall 222*b*1 of the second groove 223*b* connected to the second groove 223*b* below on the first inner surface 223*a*1 is formed of a curved surface. An angle θ4 formed between the upper groove wall 222*b*1 and the first inner surface 223*a*1 is configured to be smaller than the inclination angle θ3 between the first inner surface 223*a*1 and the second inner surface 223*a*2.

When explaining a structure of the groove 222 focusing on a second groove 222*b*, the second groove 222*b* includes an upper groove wall 222*b*1 in contact with a first separation wall 223*a*, a lower groove wall 222*b*3 in contact with a lower second separation wall 223*b*, and an intermediate groove wall 222*b*2 connecting the upper groove wall 222*b*1 and the lower groove wall 222*b*3. The upper groove wall 222*b*1 is formed as a curved surface with a relatively large radius of curvature R1 to collect droplets flowing into a groove 222 in the groove 222, and the lower groove wall 222*b*3 is formed as a curved surface with a relatively large radius of curvature R1 to collect droplets flowing into the groove 222 to swirl the droplets in the groove 222 while allowing a portion thereof to flow downwardly. Liquid collected through the lower groove wall 222*b*3 and the second inner surface 223*b*2 of the second separation wall 223*b* may pass into a third groove 222*c*, which is a lower groove.

In this case, a radius of curvature of the upper groove wall 222*b*1 may change in a curved surface rather than a single radius of curvature. In this case, the radius of curvature R1 of the upper groove wall 222*b*1 means an average radius of curvature, and it is also the same as the lower groove wall 222*b*3.

A length of the first groove 222*a* and the first separation wall 223*a* in the vertical direction D1 may be about 3 to 5 times a depth of the first groove 222*a*, and if a depth of the groove 222 increases, a flow of liquid to a lower portion thereof through the separation wall 223 to a lower portion thereof, may be insufficient, and if an overall length is too long, scattered fine droplets may not receive sufficient rotational force and may not be able to be collected.

When explaining a structure of a bowl of the present invention with reference to FIG. 7, when droplets scatter from a substrate, they are rotated by a structure of the groove 222 of the present invention and collect inside the groove 222 F1, and the liquid collected inside the groove 222 flows along the spiral groove 222 to form a downward spiral flow F2, and some liquid passes through the second inner surface 223*b*2 and the first inner surface 223*b*1 and forms a downward flow F3 beyond the separation wall 223. When a droplet scatters and collides with downward liquid flows F2 and F3 formed in this manner, a rate at which the droplet rebounds to upwardly decreases, and even if it rebounds upwardly, the angle is so small that it cannot rise back to a substrate, so that contamination of the substrate due to rebound may be prevented.

In the present invention, a curved surface of the groove 222 creates a rotational force on droplets, so that the fine droplets are collected to create large droplets or liquid flow F1, and these large droplets or liquid flow are made to fall downwardly by gravity F2 and F3, and droplets scattered by the large droplets or liquid flows are absorbed and rebound of the droplets by the bowl is prevented. In addition, the groove 222 and the separation wall 223 are configured to flow away from a center flowing downwardly, so that a downward flow is induced and as it descends at a constant speed, droplets absorption is more easily performed.

In addition, droplets or liquid flow may pass through both the separation wall 223 and the groove 222, so droplets may be absorbed no matter which direction they are scattered.

Figure 8:
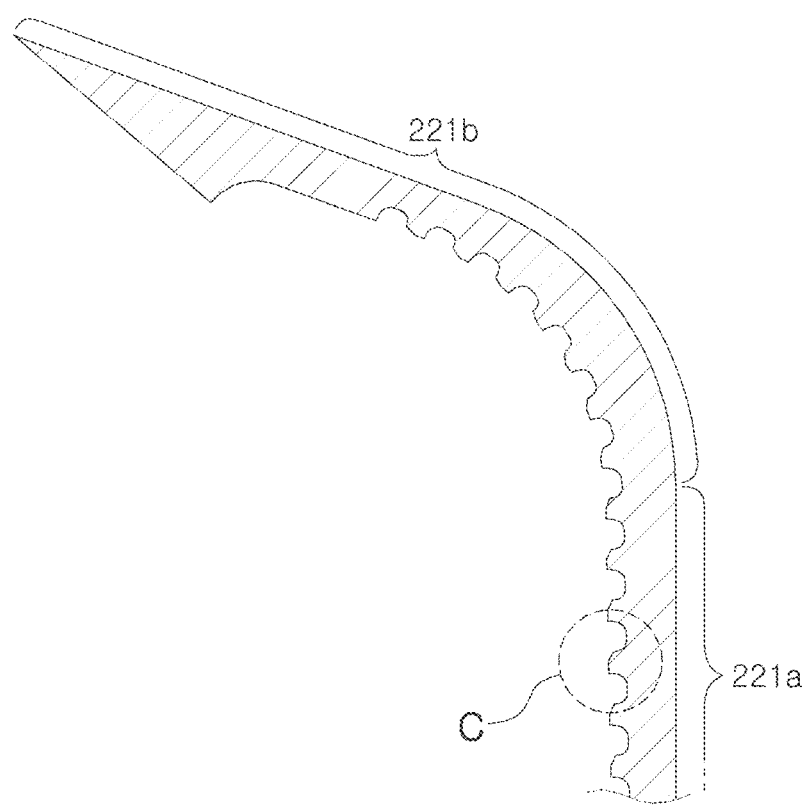
FIG. 8 is a partial cross-sectional view of a bowl according to another embodiment of the present disclosure.
Figure 9:
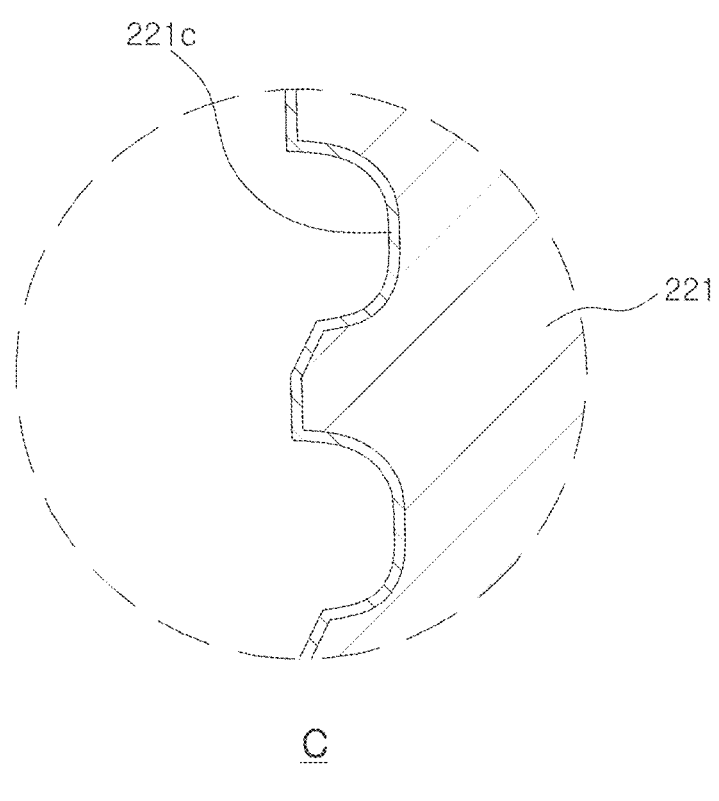
FIG. 9 is an enlarged view of portion C of FIG. 8.

FIG. 8 illustrates a cross-sectional view of a bowl of another embodiment of the present disclosure, and FIG. 9 illustrates a partially enlarged view of portion C.

Since structures of a separation wall 223 and a groove 222 in FIG. 8 are the same as the embodiment of FIGS. 4 to 7, detailed description thereof will be omitted. As illustrated in FIG. 8, the groove 222 is not only formed on a flat portion 221*a* whose outer surface is formed in a vertical direction in the main body 221, but also on an inclined portion 221*b* inclined inwardly on the outer surface thereof. In this case, the separation wall 223 and the groove 222 have the same structure.

Meanwhile, the separation wall 223 and the groove 222 do not need to be formed in an entire region of the flat portion 221*a*, and it is sufficient if they are formed only in a range where the droplets scattering from the substrate reach. In consideration of upward scattering, it is preferable that the separation wall 223 and the groove 222 be formed from an edge of the substrate to a region in which an virtual line inclined downwardly at 30° with respect to a horizontal plane contacts an inner surface of the bowl, but it can be changed depending on a rotation speed of the substrate support unit 300, and the type of chemical solution.

Likewise, even when formed on the inclined portion 221*b*, the structure of the groove 222 and the separation wall 223 may be equally applied to a region where re-contamination due to rebound is a concern.

Meanwhile, as shown in FIG. 9, a hydrophobization layer or antistatic material coating layer 221*c* may be formed through surface treatment on a surface of the inner surface forming the groove 222 and the separation wall 223. In the case of the hydrophobization layer, it may be a fine protrusion layer through surface treatment, and in the case of the antistatic material coating layer 221c, it may be a layer coated with carbon fiber, or the like. This coating layer 221c helps prevent the rebound of droplets by forming a smooth flow of droplets.

As set forth above, through the above-described configuration, in the present disclosure, a bowl receiving incident droplets to prevent the same from scattering or causing the same to scatter downwardly, and a substrate processing device including the same may be provided.

In the above, the embodiment of the present invention has been mainly described, but the present disclosure is not limited thereto and may be variously modified and implemented.

While exemplary embodiments have been shown and described above, it will be apparent to those skilled in the art that modifications and variations could be made without departing from the scope of the present invention as defined by the appended claims.

What is claimed is:

1. A bowl, comprising:
a main body surrounding a substrate support unit;
a groove formed in a spiral shape in at least a portion of an inner surface of the main body; and
a separation wall disposed between the groove and another groove in a vertical direction on the inner surface of the main body,
wherein:
the main body comprises a flat portion whose outer surface extends in a vertical direction and an inclined portion whose outer surface is formed as an inclined surface with respect to the vertical direction,
the groove is formed at least in an inner surface corresponding to the flat portion,
the groove comprises an upper groove wall having a first curved surface connected to an upper separation wall and a lower groove wall having a second curved surface connected to a lower separation wall, and
a radius of curvature of the first curved surface is greater than a radius of curvature of the second curved surface.

2. The bowl of claim 1,
wherein as the separation wall moves downwardly, a distance from the inner surface to a central axis of the bowl increases.

3. The bowl of claim 2, wherein when viewed from a cross-section perpendicular to a circumferential direction of the main body,
the groove comprises a first groove, a second groove, adjacent to the first groove and located below the first groove, and a third groove, adjacent to the second groove and located below the second groove, wherein the separation wall comprises a first separation wall disposed between the first groove and the second groove, and a second separation wall disposed between the second groove and the third groove, and
a first virtual line connecting innermost points of the first separation wall and the second separation wall and a second virtual line connecting outermost points of the first and second grooves are parallel.

4. The bowl of claim 3, wherein the first separation wall comprises a first inner surface parallel to a first angle formed by the first virtual line and the vertical direction.

5. The bowl of claim 3, wherein the first separation wall comprises a second inner surface extending from the first groove and inclined with respect to the first virtual line.

6. The bowl of claim 5, wherein the first separation wall comprises a first inner surface parallel to a first angle formed by the first virtual line and the vertical direction, and
a second angle formed by the second inner surface and the first inner surface is greater than a third angle formed by the upper groove wall in which the first inner surface extends to a groove below the separation wall and the first inner surface.

7. The bowl of claim 6, wherein the first groove and the second groove are spiral grooves, which are independently formed.

8. The bowl of claim 7, wherein the first angle is between 1 to 3°,
the groove is formed in a spiral shape on the inner surface of the main body to be inclined at a fourth angle with respect to a horizontal plane, and
the fourth angle is between 1 to 30° with respect to the horizontal plane.

9. The bowl of claim 8, wherein a vertical length of the first groove and the first separation wall is between 3 and 5 times a depth of the first groove.

10. A substrate processing device, comprising:
a container having a processing space therein;
a substrate support unit located inside the container and supporting a substrate; and
a nozzle unit spraying a processing liquid onto the substrate disposed on the substrate support unit,
wherein the container includes a bowl provided with an entrance open in a vertical direction,
wherein the bowl includes a main body surrounding the substrate support unit and a groove formed in a spiral shape in at least a portion of an inner surface of the main body, and the groove includes an upper groove wall having a first curved surface on an upper side and a lower groove wall having a second curved surface on a lower side, wherein a radius of curvature of the first curved surface is greater than a radius of curvature of the second curved surface.

11. The substrate processing device of claim 10, wherein the bowl further comprises a separation wall disposed between adjacent grooves in a vertical direction on an inner surface of the main body,
wherein the main body includes a flat portion whose outer surface extends in a vertical direction and an inclined portion whose outer surface is formed as an inclined surface with respect to the vertical direction, wherein the groove is formed at least in an inner surface corresponding to the flat portion, and as the separation wall moves downwardly, a distance from the inner surface to a central axis of the bowl increases.

12. The substrate processing device of claim 11, wherein when viewed in a cross-section perpendicular to a circumferential direction of the main body, the groove comprises a first groove, a second groove, adjacent to the first groove and located below the first groove, and a third groove, adjacent to the second groove and located below the second groove, wherein the separation wall comprises a first separation wall disposed between the first groove and the second groove and a second separation wall disposed between the second groove and the third groove, and
a first virtual line connecting innermost points of the first separation wall and the second separation wall and outermost points of the first and second grooves are parallel.

13. The substrate processing device of claim 12, wherein the first separation wall comprises a first inner surface parallel to a first angle formed by the first virtual line and the vertical direction, and
the first separation wall comprises a second inner surface located between the first inner surface and the first groove, and inclined with respect to the first virtual line.

14. The substrate processing device of claim 13, wherein a second angle formed by the second inner surface and the first inner surface is greater than a third angle formed by an upper groove wall in which the first inner surface extends to a groove below the separation wall and the first inner surface.

15. The substrate processing device of claim 14, wherein a vertical length of the first groove and the first separation wall is between 3 and 5 times a depth of the first groove.

16. The substrate processing device of claim 15, wherein the container comprises a plurality of bowls whose opening are stacked each other in a vertical direction.

17. The substrate processing device of claim 15, wherein the separation wall and the groove comprise a hydrophobic surface treatment layer or an antistatic material layer on an inner surface thereof.

18. A substrate processing device, comprising:
a container having a processing space therein;
a substrate support unit located inside the container and supporting a substrate; and
a nozzle unit spraying a processing liquid onto the substrate disposed on the substrate support unit,
wherein the container includes a bowl provided with an entrance open in a vertical direction,
wherein the bowl includes a main body surrounding the substrate support unit;
a groove formed in a spiral shape on an inner surface of the main body; and
a separation wall disposed between adjacent grooves in a vertical direction on the inner surface of the main body,
wherein the main body includes a flat portion whose outer surface extends in the vertical direction and an inclined portion whose outer surface is formed as an inclined surface with respect to the vertical direction,
wherein the groove is formed at least in an inner surface corresponding to the flat portion,
wherein when viewed in a cross-section perpendicular to a circumferential direction of the main body, the groove includes a first groove, a second groove, adjacent to the first groove and located below the first groove, and a third groove, adjacent to the second groove and located below the second groove, and the separation wall includes a first separation wall disposed between the first groove and the second groove, and a second separation wall disposed between the second groove and the third groove,
wherein a first virtual line connecting innermost points of the first separation wall and the second separation wall is inclined at a first angle in the vertical direction so that a distance from a central line of the bowl increases downwardly,
wherein the first virtual line and a second virtual line connecting outermost points of the first and second grooves are parallel,
wherein the first separation wall includes a first inner surface parallel to the first virtual line and a second inner surface extending from the first groove and inclined with respect to the first virtual line,
wherein a second angle formed by the second inner surface and the first inner surface is greater than a third angle formed by an upper groove wall in which the first inner surface extends to a groove below the separation wall and the first inner surface,
wherein the groove includes the upper groove wall having a first curved surface connected to an upper separation wall and a lower groove wall having a second curved surface connected to a lower separation wall, wherein a radius of curvature of the first curved surface is greater than a radius of curvature of the second curved surface, and
the first angle is between 1 and 3°.

19. The substrate processing device of claim 18, wherein a vertical length of the first groove and the first separation wall is between 3 and 5 times a depth of the first groove, and
the groove is formed in a spiral shape on the inner surface of the main body to be inclined at a fourth angle between 1 and 30° with respect to a horizontal plane.

* * * * *